United States Patent [19]

Ritzman

[11] Patent Number: 4,465,549

[45] Date of Patent: Aug. 14, 1984

[54] METHOD OF REMOVING A GLASS BACKING PLATE FROM ONE MAJOR SURFACE OF A SEMICONDUCTOR WAFER

[75] Inventor: Ira G. Ritzman, Paradise, Pa.

[73] Assignee: RCA Corporation, New York, N.Y.

[21] Appl. No.: 574,169

[22] Filed: Jan. 26, 1984

[51] Int. Cl.³ .................... B44C 1/22; C03C 15/00; C03C 25/06

[52] U.S. Cl. ........................., 156/630; 29/580; 134/38; 156/633; 156/655; 156/659.1; 156/345

[58] Field of Search ............ 156/630, 633, 655, 659.1, 156/663, 345; 134/28, 38, 40; 29/580, 583; 357/24

[56] References Cited

U.S. PATENT DOCUMENTS 3,640,792 2/1972 Alleman et al. .................... 156/345
3,925,657 12/1975 Levine ............................ 250/211 J
4,266,334 5/1981 Edwards et al. ..................... 29/583
4,355,229 10/1982 Zimmerman et al. ........ 250/213 VT

OTHER PUBLICATIONS

U.S. Patent Application Ser. No. 494,288, Filed on May 13, 1983, by Zollman et al., entitled, "Intensified Charge Coupled Image Sensor Having an Improved CCD Support".

Primary Examiner—William A. Powell
Attorney, Agent, or Firm—Eugene M. Whitacre; Dennis H. Irlbeck; Vincent J. Coughlin, Jr.

[57] ABSTRACT

A method is disclosed for removing a glass backing plate glued to one major surface of a semiconductor wafer having imaging elements formed on the opposed major surface of the wafer. The wafer is disposed in an etch impervious holder having a wafer support surface. The method includes the steps of providing a substantially etch impervious coating on the opposed major surface of the wafer including the imaging elements and a substantially etch impervious layer on the wafer support surface of the holder, then forming a substantially etch impervious, leak-tight seal between the wafer and the holder. The method further includes the steps of etching the glass plate in a suitable etching solution until the glass plate and the glue are dissolved from the one major surface of the wafer, and removing the substantially etch impervious coating on the opposed major surface of the wafer and the substantially etch impervious seal between the wafer and the holder. The one major surface of the wafer is cleaned to remove all traces of the glue therefrom.

13 Claims, 4 Drawing Figures

METHOD OF REMOVING A GLASS BACKING PLATE FROM ONE MAJOR SURFACE OF A SEMICONDUCTOR WAFER

The invention relates to a method of removing a glass backing plate from one major surface of a semiconductor wafer and more particularly to a method of delaminating a CCD imager for use in an intensified charge coupled image sensor.

BACKGROUND OF THE INVENTION

An intensified charge coupled image sensor comprises an image intensifier tube having a photoemissive cathode on an interior surface of an input window and a charge coupled device (CCD) imager located at the focal plane of the image intensifier tube. Such a structure is described in U.S. Pat. No. 4,355,229, issued to H. S. Zimmerman et al., on Oct. 19, 1982. The Zimmerman et al. patent is incorporated by reference herein for the purpose of disclosure.

The CCD imager is manufactured by producing a number of discrete CCD imagers on a single semiconductor wafer. As disclosed in U.S. Pat. No. 4,266,334, issued to T. W. Edwards et al., on May 12, 1981, if one desires to sense color information, it is necessary to thin the wafer substrate to a thickness of about $10\mu$ (microns). However, because of the fragility of the thinned substrate, it is very difficult to test the CCD imagers after they are thinned. The reason is that the test probes tend to break or otherwise damage the thinned substrate. The Edwards et al. patent, referenced above and incorporated by reference herein for disclosure purposes, describes a method which permits numerous thinned CCD imagers to be made on a single larger wafer and then easily tested, cut out and mounted with little risk or breakage. In the Edwards et al. patent, a relatively large silicon wafer with proper doping is processed in the conventional way, using photolithographic techniques, to produce a relatively large number of CCD's on a common thick substrate. The front surface (the surface containing the electrodes) of the wafer is masked, for example, by placing it in a special masking fixture, or by employing a substance, such as a resist. The masking fixture or substance is made to cover the front surface (the one containing the electrodes) of the wafer and the peripheral edge of the back surface of the wafer. Now instead of thinning the individual devices one at a time, as in the prior art, the entire wafer is thinned in a rotary etching bath to the desired thickness over its entire center area, leaving only an unthinned rim around the peripheral edge of the wafer for support. Then a sheet of glass, which fits into the thinned region, is glued to the back surface, as shown in FIG. 1, to provide a laminated structure which is strong and rigid. The individual devices may then be separated from one another by cutting through the glass and thinned substrate between the imagers.

The CCD's thinned by this method cannot be used directly in intensified charge coupled image sensors because the adhesive used to glue the sheet of glass into the thinned region of the wafer adversely affects the formation of the photoemissive cathode within the image intensifier tube, and the glass sheet and adhesive attenuate the electrons emitted from the photoemissive cathode preventing the electrons from entering the CCD. It is therefore necessary to remove the glass and adhesive from the device after testing and before the device can be mounted within the image intensifier tube. Heretofore, in order to remove the glass, the wafer containing a number of CCD's was placed into an etching holder, shown in FIG. 2. A combination of sulfuric acid ($H_2SO_4$) and hydrofluoric (HF) acid was put into the top section of the holder to etch the glass sheet. Unfortunately, acid leakage from the top section of the holder to the lower section frequently occurred with the resultant loss of many CCD imagers through contact of the acid with the electrodes of the CCD imagers.

SUMMARY OF THE INVENTION

A method is disclosed for removing a glass backing plate glued to one major surface of a semiconductor wafer having imaging elements formed on the opposed major surface of the wafer. The wafer is disposed in an etch impervious holder having a wafer support surface. The method includes the steps of providing a substantially etch impervious coating on the opposed major surface of the wafer including the imaging elements and a substantially etch impervious layer on the wafer support surface of the holder, thereby forming a substantially etch impervious, leak-tight seal between the wafer and the holder. The method further includes the steps of etching the glass plate in a suitable etching solution until the glass plate and the glue are dissolved from the one major surface of the wafer, and removing the substantially etch impervious coating on the opposed major surface of the wafer and the substantially etch impervious seal between the wafer and the holder. The one major surface of the wafer is cleaned to remove all traces of the glue therefrom.

DETAILED DESCRIPTION OF THE PREFERRED EMBODIMENTS

Figure 1:
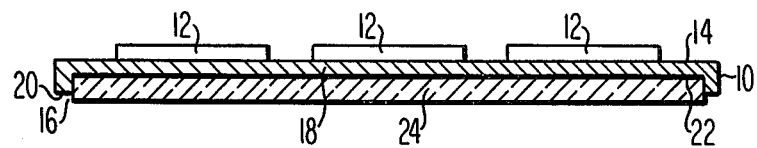
FIG. 1 is an enlarged sectional view of a silicon wafer containing a number of CCD imagers having a glass backing plate glued onto a thinned major surface of the wafer.

With reference to FIG. 1, a silicon wafer 10 with proper impurity doping is processed in the conventional way, using photolithographic techniques to produce a relatively large number of CCD imagers 12 on a first major surface 14 of the wafer 10. The second major surface 16 is thinned by conventional means disclosed in the above-referenced Edwards et al. patent to provide a thinned substrate 18 having a thickness of about $10\mu$ (microns) which is surrounded by an annular rim 20 having a thickness of about 0.30 to 0.38 mm (12 to 15 mils). A liquid adhesive 22, such as epoxy, is applied to the second surface 16 within the area of the thinned substrate 18, and a glass backing plate 24 having a thickness ranging from about 0.25 to about 0.51 mm (10 to 20 mils) is glued to the second surface 16 of the wafer 10 to provide structural support to the wafer. After the adhesive 22 has cured, the resulting laminated structure is very strong and very rigid. It is now possible to use a conventional probe station to test the individual imagers 12 without worrying about cracking or otherwise damaging the thinned substrate 18.

Figure 3:
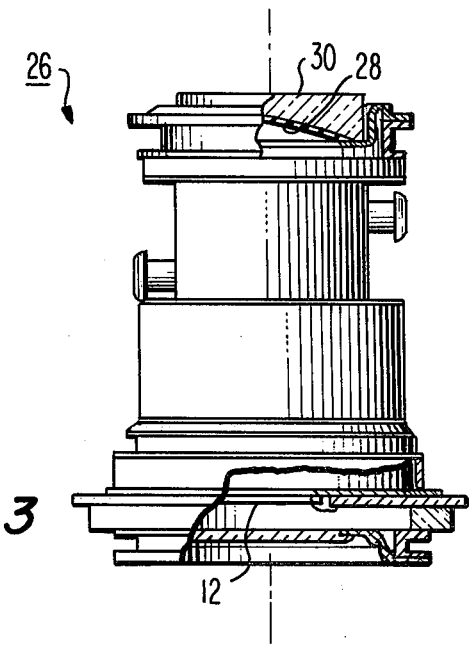
FIG. 3 is an elevational view, partially in section, of an intensified charge coupled image sensor.

If the CCD imager 12 is to be used in an application where photons are directly incident upon the imager, then the glass backing plate 24 need not be removed from the CCD imager 12. However, if the CCD imager 12 is to be used in an imaging device, such as in an intensified charge coupled image sensor 26, shown in FIG. 3, where photoelectrons from a photoemissive cathode 28 disposed on the interior surface of an input window 30 provide the incident species of radiation to the CCD imager 12, then it is necessary to remove the glass backing plate 24 from the imager 12. Removal of the glass backing plate 24 is required because the adhesive 22 (epoxy) contains organic materials which adversely affect the formation of the photoemissive cathode 28, and the glass backing plate 24 and adhesive 22 attenuate the photoelectrons emitted from the photoemissive cathode 28, thereby preventing the photoelectrons from entering the CCD imager 12. The fabrication and operation of an intensified charge coupled image sensor 26 is disclosed in the above-referenced Zimmerman et al. patent and in copending U.S. patent application, Ser. No. 494,288, filed on May 13, 1983, by J. A. Zollman et al., and entitled, "INTENSIFIED CHARGE COUPLED IMAGE SENSOR HAVING AN IMPROVED CCD SUPPORT". The Zollman et al. application is also incorporated by reference herein for the purpose of disclosure.

Figure 2:
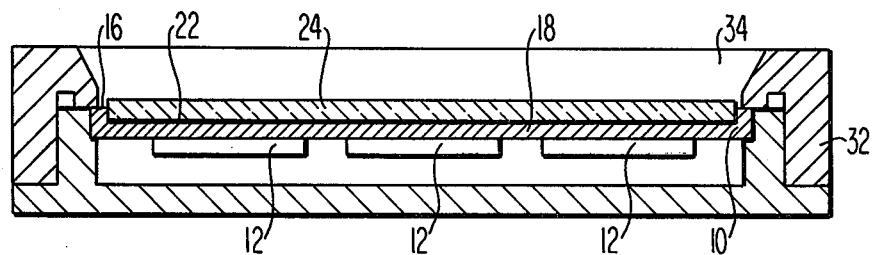
FIG. 2 is an enlarged sectional view of a silicon wafer containing a number of CCD imagers and a glass backing plate in a prior art etching holder.

A conventional etching fixture 32 used to remove the glass backing plate 24 from the second major surface 16 of the thinned substrate 18 is shown in FIG. 2. An acid etching solution, comprising 3 parts sulfuric acid and one part hydroflouric acid at a temperature of about 40° to 70° C., is placed in the top section 34 of the fixture 32. As previously described, acid frequently leaks from the top section of the fixture to the lower section and damages the CCD imagers 12 therein. Even the addition of a silicon rubber O-ring (not shown) around the periphery of the wafer 10, between the wafer 10 and the lower section of the fixture 32, does not prevent acid leakage and damage to the imagers 12. The fixture 32 frequently stresses the wafer 10 and breaks the wafer resulting in the loss of the imagers 12 formed thereon.

Figure 4:
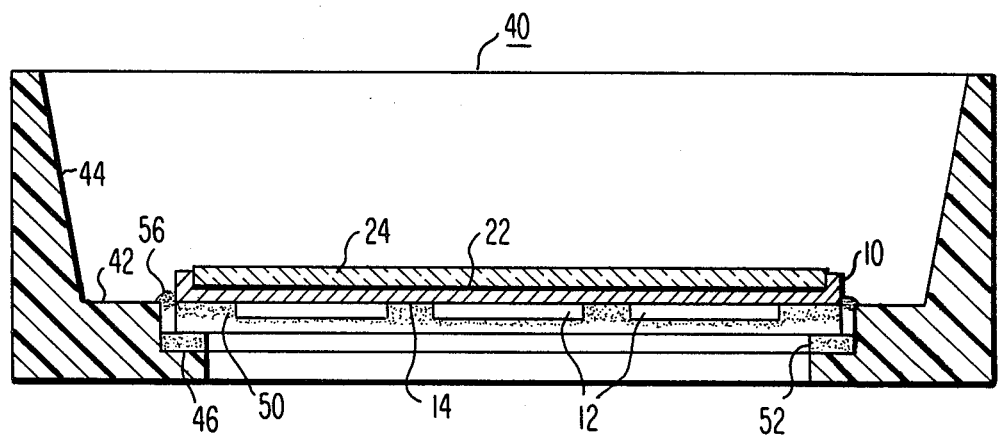
FIG. 4 is an enlarged sectional view of a silicon wafer containing a number of CCD imagers and a glass backing plate in an etching holder for utilizing the present invention.

A novel method of removing the glass backing plate 24 from the thinned substrate 18 will be described with reference to FIG. 4. An acid impervious etching holder 40, for example of Teflon (trademark), is formed having a centrally apertured lower portion 42 surrounded by a wall portion 44. The lower portion 42 includes a wafer support surface 46, which has an outside diameter slightly larger than the outside diameter of the wafer 10. By means of example and not limitation, the outside diameter of the wafer support surface 46 is about 76.835±0.127 mm (3.025±0.005 inches) for a wafer 10 having an outside diameter of 76.2 mm (3 inches). A substantially acid impervious coating 50 of, for example, Miccroshield (trademark) stop-off laquer, is applied to the first major surface 14 of the wafer 10. The coating 50 is uniformly applied and covers the CCD imagers 12. Preferably, the coating 50 is applied, while the wafer 10 is spun with the major surfaces 14 and 16 horizontally disposed, and the first major surface 14 facing upward. The coating 50 is allowed to air dry. A uniform layer 52 of substantially acid impervious Miccroshield stop-off laquer is applied to the wafer support surface 46. The wafer 10 is disposed within the holder 40 so that the coating 50 on the first surface 14 of the wafer 10 is adjacent to the substantially acid impervious layer 52 on the wafer support surface 46. A 50 gram weight, not shown, is disposed on the glass backing plate 24 to urge the wafer 10 against the wafer support surface 46. The weight causes some of the stop-off laquer of the layer 52 to ooze between the periphery of the wafer 10 and the lower portion 42 of the holder 40. The layer 52 is allowed to air dry and then heated in air at a temperature between about 60° to 70° C. for about 15 minutes to complete the drying process. An additional quantity of Miccroshield stop-off laquer is then disposed around the periphery of the wafer 10 to form a bead 56 which provides a substantially acid impervious leak-tight seal between the periphery of the wafer 10 and the lower portion 42 of the holder 40.

A conventional glass etching solution is formed by combining three parts sulfuric acid and one part hydrofluoric acid. The acids are heated within the range of about 40° to about 70° C. and poured into the holder 40 until the etching solution covers the glass plate 24 to a depth of about 6 to 12.5 mm (0.25 to 0.5 inches). The etching is monitored, and the solution is changed when a white precipate covers the glass plate 24 or in about 5 to 10 minutes. Typically, about 2 to 3 changes of acid are necessary to remove the glass plate 24 and the adhesive 22. When the etching step is completed, the etching solution is discarded, and deionized water is used to wash the etched surface of the wafer and the holder 40.

The holder 40 with the wafer 10 attached thereto is soaked in acetone to dissolve the Miccroshield stop-off laquer coating 50, layer 52 and bead 56 to release the wafer 10 from the holder 40.

The wafer 10 is cleaned by rinsing the entire wafer in deionized water. Then the etched surface (the thinned substrate 18 of the second major surface 16) is carefully cleaned by applying a few drops of caros acid (about 80 percent sulfuric acid and 20 percent hydrogen peroxide) at a temperature of less than about 70° C. for about 30 to 60 seconds. The annular rim 20 confines the caros acid to the etched surface of the wafer 10. The caros acid removes any residual organic materials, such as the adhesive 22, and provides a very clean silicon surface. The wafer 10 is again washed in deionized water and dried in a conventional freon dryer.

Subsequent processing includes sectioning the wafer 10 to form individual CCD imagers for use in the intensified charge coupled image sensors 26. The subsequent processing is described in the above-referenced Zollman et al. patent application.

What is claimed is:

1. A method of removing a glass backing plate from one major surface of a semiconductor wafer, said glass plate being glued to said one major surface, said wafer having imaging elements formed on the opposed major surface thereof, said wafer being disposed in an etch impervious holder having a wafer support surface, the method comprising the steps of
   a. providing a substantially etch impervious coating on the opposed major surface of said wafer including said imaging elements,
   b. providing a substantially etch impervious layer on said wafer support surface of said holder,
   c. providing a substantially etch impervious, leak-tight seal between said wafer and said holder, d. etching said glass plate in a suitable etching solution until said glass plate and the glue are dissolved from the one major surface, e. removing said substantially etch impervious coating on the opposed major surface of said wafer and the substantially etch impervious seal between said wafer and said holder, and f. cleaning the one major surface of said wafer to remove all residual traces of glue therefrom.

2. The method as in claim 1, wherein step a. further includes the step of drying the substantially etch impervious coating on the opposed major surface of the wafer.

3. The method as in claim 1, wherein step b. further includes the steps of
 i. disposing said wafer in said holder so that the substantially acid impervious coating on the opposed major surface of the wafer is in contact with the substantially etch impervious layer,
 ii. urging said wafer against said wafer support surface of said holder,
 iii. drying the substantially etch impervious layer on the wafer support surface of the holder; and
 iv. heating the substantially etch impervious layer in air at a temperature between about 60° to 70° C. for about 15 minutes.

4. The method as in claim 1, wherein step d. further includes the step of discarding the etching solution and adding a fresh etching solution about every 5 to 10 minutes until the glass plate and the glue are dissolved.

5. A method of removing a glass backing plate from one major surface of a semiconductor wafer, said glass plate being glued to said one major surface, said wafer having at least one imager formed on the opposed major surface thereof, said wafer being disposed in an acid impervious holder having a wafer support surface, the method comprising the steps of
 a. providing a substantially acid impervious coating on the opposed major surface of said wafer including said imager,
 b. providing a substantially acid impervious layer on said wafer support surface of said holder,
 c. disposing said wafer in said holder so that said substantially acid impervious coating on the opposed major surface of said wafer is adjacent to said substantially acid impervious layer on said support surface of said holder,
 d. providing a substantially acid impervious, leaktight seal between the periphery of said wafer and said holder,
 e. etching said glass plate in a suitable acid etching solution until said glass plate and the glue are dissolved from the one major surface,
 f. removing said substantially acid impervious seal between the periphery of said wafer and said holder, said substantially acid impervious layer on the sealing surface of said holder and the substantially acid impervious coating on said one major surface of said wafer, and
 g. cleaning the one major surface of said wafer to remove all residual traces of glue therefrom.

6. The method as in claim 5, wherein step a. further includes the step of drying the substantially acid impervious coating on the opposed major surface of the wafer.

7. The method as in claim 5, wherein step b. further includes the steps of
 i. urging said wafer against said wafer support surface of said holder having the substantially acid impervious layer thereon,
 ii. drying the substantially acid impervious layer on the wafer support surface of the holder, and
 iii. heating the substantially acid impervious layer in air at a temperature between about 60° to 70° C. for about 15 minutes.

8. The method as in claim 5, wherein step e. further includes the step of discarding the acid etching solution and adding a fresh acid etching solution about every 5 to 10 minutes until the glass plate and the glue are dissolved.

9. A method of removing a glass backing plate from one major surface of a semiconductor wafer, said glass plate being glued to said one major surface, said wafer having a plurality of imagers formed on the opposed major surface thereof, said wafer being disposed in an acid impervious holder having a wafer support surface surrounded by a wall portion, the method comprising the steps of
 a. providing a substantially acid impervious laquer coating on the opposed major surface of said wafer including said imagers,
 b. drying said laquer coating,
 c. providing a substantially acid impervious laquer layer on said wafer support surface of said holder,
 d. disposing said wafer in said holder so that said acid impervious coating on the opposed major surface of said wafer is adjacent to said acid impervious laquer layer on said support surface of said holder,
 e. urging said wafer against said wafer support surface of said holder,
 f. providing a substantially acid impervious, leaktight seal between the periphery of said wafer and said holder,
 g. filling said holder with an etching solution comprising about three parts sulfuric acid and one part hydrofluoric acid to a depth sufficient to cover said glass plate,
 h. etching said glass plate until said glass plate and the glue are dissolved,
 i. discarding said etching solution,
 j. rinsing the etched surface of said wafer and said holder with deionized water,
 k. dissolving said laquer coating and laquer layer in acetone to release said wafer from said holder and to remove said coating from said wafer, and
 l. cleaning said wafer.

10. The method as in claim 9, wherein step e. includes the step of drying the substantially acid impervious laquer layer.

11. The method as in claim 9, wherein step g. includes the steps of heating the etching solution to a temperature of about 40° to 70° C. before filling said holder with the etching solution.

12. The method as in claim 9, wherein step i. further includes the step of adding a fresh etching solution about every 5 to 10 minutes until the glass plate and the glue are dissolved.

13. The method of claim 9, wherein step l. includes the steps of
 i. rinsing the wafer in deionized water,
 ii. exposing the etched surface of the wafer to caros acid at a temperature of less than 70° C. for about 30 to 60 seconds to remove all residual traces of glue and to provide a clean wafer surface,
 iii. rinsing the wafer in deionized water, and
 iv. drying the wafer in a freon dryer.

* * * * *